United States Patent
Mizusawa (10) Patent No.: US 8,236,380 B2
(45) Date of Patent: Aug. 7, 2012

(54) GAS SUPPLY SYSTEM, SUBSTRATE PROCESSING APPARATUS AND GAS SUPPLY METHOD

(75) Inventor: Kenetsu Mizusawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 847 days.

(21) Appl. No.: 12/371,212

(22) Filed: Feb. 13, 2009

(65) Prior Publication Data

US 2009/0145484 A1 Jun. 11, 2009

Related U.S. Application Data

(62) Division of application No. 11/669,114, filed on Jan. 30, 2007, now abandoned.

(60) Provisional application No. 60/771,441, filed on Feb. 9, 2006.

(30) Foreign Application Priority Data

Jan. 31, 2006 (JP) ................................. 2006-021879

(51) Int. Cl.
  *C23C 16/00* (2006.01)
  *C23C 16/52* (2006.01)
  *C23C 14/54* (2006.01)
  *C23F 1/00* (2006.01)

(52) U.S. Cl. ....... 427/248.1; 118/715; 118/50; 118/663; 118/692; 156/345.1; 156/345.24; 156/345.26

(58) Field of Classification Search ............... 427/248.1; 118/715–733; 156/345.1–345.55
See application file for complete search history.

(56) References Cited

U.S. PATENT DOCUMENTS

| 2005/0005994 A1* | 1/2005 | Sugiyama et al. ............... 141/4 |
| 2005/0028934 A1 | 2/2005 | Miya et al. |
| 2006/0124169 A1* | 6/2006 | Mizusawa et al. ............... 137/7 |

FOREIGN PATENT DOCUMENTS

JP 2005-56914 3/2005

OTHER PUBLICATIONS

Office Action issued Sep. 13, 2011 in Japan Application No. 2006-021879 (With English Translation).

* cited by examiner

*Primary Examiner* — Timothy Meeks
*Assistant Examiner* — Mandy Louie
(74) *Attorney, Agent, or Firm* — Oblon, Spivak, McClelland, Maier & Neustadt, L.L.P.

(57) ABSTRACT

A gas supply system for supplying a gas into a processing chamber for processing a substrate to be processed includes: a processing gas supply unit; a processing gas supply line; a first and a second processing gas branch line; a branch flow control unit; an additional gas supply unit; an additional gas supply line; a first and a second additional gas branch line; a flow path switching unit; and a control unit. Before processing the substrate to be processed, the control unit performs a pressure ratio control on the branch flow control unit while the processing gas supply unit supplies the processing gas. After the inner pressures of the first and the second processing gas branch line become stable, the control unit switches the pressure ratio control to a fixed pressure control, and then the additional gas supply unit supplies the additional gas.

8 Claims, 6 Drawing Sheets

GAS SUPPLY SYSTEM, SUBSTRATE PROCESSING APPARATUS AND GAS SUPPLY METHOD

CROSS-REFERENCE TO RELATED APPLICATIONS

This application is a divisional of U.S. application Ser. No. 11/669,114, filed on Jan. 30, 2007, the entire contents of which is incorporated herein by reference. U.S. Ser. No. 11/669,114 claims the benefit of priority under 119(e) of U.S. Provisional Application No. 60/771,441, filed Feb. 9, 2006, and claims the benefit of priority under 35 U.S.C. §119 from Japanese Patent Application No. 2006-021879 filed Jan. 31, 2006.

FIELD OF THE INVENTION

The present invention relates to a gas supply system for supplying a gas into a processing chamber, a substrate processing apparatus and a gas supply method.

BACKGROUND OF THE INVENTION

A substrate processing apparatus is configured to perform specific processes such as a film forming process, an etching process and the like on a substrate to be processed (hereinafter, simply referred to as "substrate") such as a semiconductor wafer, a liquid crystal substrate or the like.

As for such a substrate processing apparatus, there has been known a plasma processing apparatus, for example. The plasma processing apparatus includes, inside a processing chamber, a lower electrode serving also as a mounting table for mounting thereon a substrate and an upper electrode serving also as a shower head for injecting a gas toward the substrate. Such a parallel plate type plasma processing apparatus is configured to perform specific processes such as a film forming process, an etching process and the like with the use of a plasma generated by applying a high frequency power between both electrodes while supplying a specific gas through the shower head onto the substrate in the processing chamber.

In performing on the substrate specific processes such as a film forming process, an etching process and the like, there has been demanded to improve in-surface uniformity in processing the substrate by making processing characteristics (e.g., an etching rate, an etching selectivity, a film forming rate and the like) uniform in a surface of the substrate.

In such a view, in Japanese Patent Laid-open Application Nos. H8-158072 and H9-45624, there have been proposed techniques for supplying a processing gas of optional composition at an optional flow rate to plural portions on a substrate surface via gas supply lines individually connected with a plurality of gas chambers formed by dividing the inside of the shower head. In accordance with such techniques, the in-surface uniformity in etching the substrate can be improved by locally adjusting a gas concentration on the substrate surface.

A gas used for an actual substrate processing is obtained by mixing plural types of gases, e.g., a processing gas directly participating in a substrate processing, a gas for controlling a deposition of reaction products generated in the substrate processing, a carrier gas such as an inactive gas or the like, and the like. The types of gases are appropriately selected depending on target materials on the substrate or processing conditions. Therefore, there arises a need to perform a flow rate control by using a mass flow controller provided on each of the gas supply lines respectively connected with the gas chambers in the shower head, as disclosed in Japanese Patent Laid-open Application No. H9-45624.

However, in such a conventional configuration, although the gases supplied to plural portions on a substrate surface include common gases, each of the gases supplied from the gas chambers has its own gas supply system and, also, flow rates thereof are individually controlled. Accordingly, a line configuration and a flow rate control in each of the lines become complicated, which results in requiring a large space for the lines and an increased burden of control.

Further, even if the gases can be supplied from plural portions in the processing chamber by a simple control operation, when a flow rate ratio (distribution ratio) of the processing gases supplied from the plural portions changes due to a pressure variation, for example, during the introduction of the gases, the desired in-surface uniformity cannot be achieved. Hence, it is important to control the gas supply such that the process is prevented from being influenced by effects from the pressure variation and the like.

SUMMARY OF THE INVENTION

It is, therefore, an object of the present invention to provide a gas supply system and the like, capable of achieving a desired in-surface uniformity by supplying gases from plural portions in a processing chamber with a simple line configuration and a simple control operation.

In accordance with one aspect of the invention, there is provided a gas supply system for supplying a gas into a processing chamber for processing a substrate to be processed, the system including:

a processing gas supply unit for supplying processing gas for processing the substrate to be processed;

a processing gas supply line for allowing the processing gas from the processing gas supply unit to flow therein;

a first and a second processing gas branch line branched from the processing gas supply line to be connected with different portions of the processing chamber;

a branch flow control unit for controlling branch flows of the processing gas distributed from the processing gas supply line to the first and the second processing gas branch line based on inner pressures of the first and the second processing gas branch line, respectively;

an additional gas supply unit for supplying additional gas;

an additional gas supply line for allowing the additional gas from the additional gas supply unit to flow therein;

a first additional gas branch line branched from the additional gas supply line to be connected with the first processing gas branch line at a downstream side of the branch flow control unit;

a second additional gas branch line branched from the additional gas supply line to be connected with the second processing gas branch line at a downstream side of the branch flow control unit;

a flow path switching unit for switching a flow path of the additional gas from the additional gas supply line between the first and the second additional gas branch line; and a control unit for supplying, before processing the substrate to be processed, the processing gas from the processing gas supply unit while performing a pressure ratio control on the branch flow control unit such that a pressure ratio between the inner pressures of the first and the second processing gas branch line is kept at a target pressure ratio, and then supplying the additional gas from the additional gas supply unit after the inner pressures of the first and the second processing gas branch line become stable to be at a first and a second stable inner pressure, wherein in case of supplying the additional gas to the second processing gas branch line via the second additional gas branch line, the additional gas is supplied from the additional gas supply unit after the control unit switches the pressure ratio control on the branch flow control unit to a first fixed pressure control that controls the branch flows such that the first stable inner pressure is maintained in the first processing gas branch line, whereas in case of supplying the additional gas to the first processing gas branch line via the first additional gas branch line, the additional gas is supplied from the additional gas supply unit after the control unit switches the pressure ratio control on the branch flow control unit to a second fixed pressure control that controls the branch flows such that the second stable inner pressure is maintained in the second processing gas branch line.

In accordance with another aspect of the invention, there is provided a substrate processing apparatus including:

a processing chamber for processing a substrate to be processed;

a gas supply system for supplying a gas into the processing chamber; and a control unit for controlling the gas supply system, wherein the gas supply system includes:

a processing gas supply unit for supplying processing gas for processing the substrate to be processed;

a processing gas supply line for allowing the processing gas from the processing gas supply unit to flow therein;

a first and a second processing gas branch line branched from the processing gas supply line to be connected with different portions of the processing chamber;

a branch flow control unit for controlling branch flows of the processing gas distributed from the processing gas supply line to the first and the second processing gas branch line based on inner pressures of the first and the second processing gas branch line, respectively;

an additional gas supply unit for supplying additional gas;

an additional gas supply line for allowing the additional gas from the additional gas supply unit to flow therein;

a first additional gas branch line branched from the additional gas supply line to be connected with the first processing gas branch line at a downstream side of the branch flow control unit;

a second additional gas branch line branched from the additional gas supply line to be connected with the second processing gas branch line at a downstream side of the branch flow control unit; and a flow path switching unit for switching a flow path of the additional gas from the additional gas supply line between the first and the second additional gas branch line, and wherein the control unit supplies, before processing the substrate to be processed, the processing gas from the processing gas supply unit while performing a pressure ratio control on the branch flow control unit such that a pressure ratio between the inner pressures of the first and the second processing gas branch line is kept at a target pressure ratio, and then supplies the additional gas from the additional gas supply unit after the inner pressures of the first and the second processing gas branch line become stable to be at a first and a second stable inner pressure, wherein in case of supplying the additional gas to the second processing gas branch line via the second additional gas branch line, the additional gas is supplied from the additional gas supply unit after the control unit switches the pressure ratio control on the branch flow control unit to a first fixed pressure control that controls the branch flows such that the first stable inner pressure is maintained in the first processing gas branch line, whereas in case of supplying the additional gas to the first processing gas branch line via the first additional gas branch line, the additional gas is supplied from the additional gas supply unit after the control unit switches the pressure ratio control on the branch flow control unit to a second fixed pressure control that controls the branch flows such that the second stable inner pressure is maintained in the second processing gas branch line.

In accordance with still another aspect of the invention, there is provided a gas supply method for use with a gas supply system for supplying a gas into a processing chamber for processing a substrate to be processed, wherein the gas supply system includes a processing gas supply unit for supplying processing gas for processing the substrate to be processed; a processing gas supply line for allowing the processing gas from the processing gas supply unit to flow therein; a first and a second processing gas branch line branched from the processing gas supply line to be connected with different portions of the processing chamber; a branch flow control unit for controlling branch flows of the processing gas distributed from the processing gas supply line to the first and the second processing gas branch line based on inner pressures of the first and the second processing gas branch line, respectively; an additional gas supply unit for supplying additional gas; an additional gas supply line for allowing the additional gas from the additional gas supply unit to flow therein; a first additional gas branch line branched from the additional gas supply line to be connected with the first processing gas branch line at a downstream side of the branch flow control unit; a second additional gas branch line branched from the additional gas supply line to be connected with the second processing gas branch line at a downstream side of the branch flow control unit; and a flow path switching unit for switching a flow path of the additional gas from the additional gas supply line between the first and the second additional gas branch line, the method including the steps of:

supplying, before processing the substrate to be processed, the processing gas from the processing gas supply unit while performing a pressure ratio control on the branch flow control unit such that a pressure ratio between the inner pressures of the first and the second processing gas branch line is kept at a target pressure ratio; and supplying the additional gas from the additional gas supply unit after the inner pressures of the first and the second processing gas branch line become stable to be at a first and a second stable inner pressure, wherein in case of supplying the additional gas to the second processing gas branch line via the second additional gas branch line, the additional gas is supplied from the additional gas supply unit after the control unit switches the pressure ratio control on the branch flow control unit to a first fixed pressure control that controls the branch flows such that the first stable inner pressure is maintained in the first processing gas branch line, whereas in case of supplying the additional gas to the first processing gas branch line via the first additional gas branch line, the additional gas is supplied from the additional gas supply unit after the control unit switches the pressure ratio control on the branch flow control unit to a second fixed pressure control that controls the branch flows such that the second stable inner pressure is maintained in the second processing gas branch line.

In accordance with such aspects of the present invention, the processing gas from the processing gas supply unit is distributed into the first and the second branch line. The processing gas distributed into any one of the processing gas branch lines is supplied to the processing chamber as it is from the processing gas supply unit, whereas the processing gas distributed into the other processing gas branch line is added with the additional gas and then supplied to the processing chamber with adjusted gas components and flow rates. Accordingly, the processing gas having components common to each of the processing gas branch lines can be supplied from a common processing gas supply unit to each of the processing gas branch lines and, also, the gas components or the flow rates of the processing gas flowing in the latter branch line can be adjusted by adding thereto the additional gas on demand. Therefore, it is possible to minimize the number of lines, which leads to a simple line configuration and a simple flow rate control.

Since the branch flow control of the branch flow control unit is switched from the pressure ratio control to the fixed pressure control before supplying the additional gas, even if the inner pressure of the latter processing gas branch line (e.g., the second branch line) is changed due to the supply of the additional gas, a part of the processing gas required to flow toward the latter processing gas branch line can be prevented from flowing toward the former processing gas branch line. Accordingly, the ratio of the flow rates (distribution amounts) of the processing gas distributed into the processing gas branch lines can be prevented from being changed while supplying the additional gas. As a result, the processing gas distributed at a target flow rate ratio can be supplied to other regions on the surface of the substrate, which leads to a desired in-surface uniformity.

Preferably, when the inner pressures of the first and the second processing gas branch line become stable to be at a third and a fourth stable inner pressure after supplying the additional gas, the control unit sets a pressure ratio between the third and the fourth stable inner pressure as a new target pressure ratio; and switches the fixed pressure control on the branch flow control unit to another pressure ratio control that controls the branch flows such that a pressure ratio between the inner pressures of the first and the second processing gas branch line is kept at the new target pressure ratio. By switching the branch flow control of the branch flow control unit from the fixed pressure control to the pressure ratio control, the pressure ratio between the first and the second processing gas branch line can be prevented from being changed during a following processing of the substrate. This is because when the conductance of the gas injection openings is changed, the inner pressures of the first and the second processing gas branch line are also changed. Accordingly, even when the conductance of the gas injection openings is temporally changed, it is possible to avoid a change of the ratio of the flow rates of the processing gas flowing through the first and the second processing gas branch line.

Preferably, the branch flow control unit has valves for controlling flow rates of the processing gas flowing through the first and the second processing gas branch line; and pressure sensors that detect the inner pressures of the first and the second processing gas branch line, respectively, wherein a ratio of the flow rates of the processing gas flowing through the first and the second processing gas branch line is controlled by controlling the valves based on the inner pressures detected by the pressure sensors.

Preferably, the processing gas supply unit has a plurality of gas supply sources to supply to the processing gas supply line the processing gas obtained by mixing gases from the gas supply sources at a specific flow rate ratio. Preferably, the additional gas supply unit has a number of gas supply sources to supply to the additional gas supply line, the additional gas obtained by selecting a gas from the gas supply sources or by mixing gases therefrom at a specific gas flow rate ratio. Accordingly, the processing gas having components common to each of the processing gas branch lines can be supplied from a processing gas supply unit to each of the processing gas branch lines and, also, the gas components or the flow rates of the processing gas flowing in the latter branch line can be adjusted by adding thereto the additional gas on demand. Therefore, the number of lines can be minimized, which leads to a simple line configuration and a simple flow rate control.

Preferably, the first processing gas branch line is arranged to supply the processing gas flowing therein toward a central region on a surface of the substrate disposed in the processing chamber; and the second processing gas branch line is arranged to supply the processing gas flowing therein toward a peripheral region on the surface of the substrate. Accordingly, it is possible to improve uniformity in processing the central region and the peripheral region of the substrate to be processed.

Preferably, the second processing gas branch line is configured as plural branch lines branched from the processing gas supply line, and the additional gas from the additional gas supply unit is supplied to each of the plural branch lines. In this way, the processing gas can be supplied to plural portions of the peripheral region of the wafer, so that it is possible to more precisely control the uniformity in processing the peripheral region of the wafer.

In accordance with still another aspect of the present invention, there is provided a gas supply system for supplying a gas into a processing chamber for processing a substrate to be processed, the system including:

a processing gas supply unit for supplying processing gas for processing the substrate to be processed;

a processing gas supply line for allowing the processing gas from the processing gas supply unit to flow therein;

a first and a second processing gas branch line branched from the processing gas supply line to be connected with different portions of the processing chamber;

a branch flow control unit for controlling branch flows of the processing gas distributed from the processing gas supply line to the first and the second processing gas branch line based on inner pressures of the first and the second processing gas branch line, respectively;

an additional gas supply unit for supplying additional gas;

an additional gas supply line for allowing the additional gas from the additional gas supply unit to flow therein;

a first additional gas branch line branched from the additional gas supply line to be connected with the first processing gas branch line at a downstream side of the branch flow control unit;

a second additional gas branch line branched from the additional gas supply line to be connected with the second processing gas branch line at a downstream side of the branch flow control unit; and an opening/closing valve, provided on each of either one or both of the first and the second additional gas branch line, for opening and closing each of said either one or both of the additional gas branch lines.

In accordance with the present invention, the flow path for allowing the additional gas from the additional gas supply line to flow therein can be switched by controlling the opening/closing valves. Moreover, the additional gas can be supplied from the first and the second additional gas branch line to the first and the second processing gas branch line by providing opening/closing valves on the first and the second additional gas branch line.

BRIEF DESCRIPTION OF THE DRAWINGS

The above and other objects and features of the present invention will become apparent from the following description of embodiments, given in conjunction with the accompanying drawings, in which.

DETAILED DESCRIPTION OF THE EMBODIMENT

Hereinafter, embodiments of the present invention will be described in detail with reference to the accompanying drawings. Like reference numerals will be given to like parts having substantially the same functions, and redundant description thereof will be omitted in the specification and the accompanying drawings.

(Configuration Example of Substrate Processing Apparatus)

Figure 1:
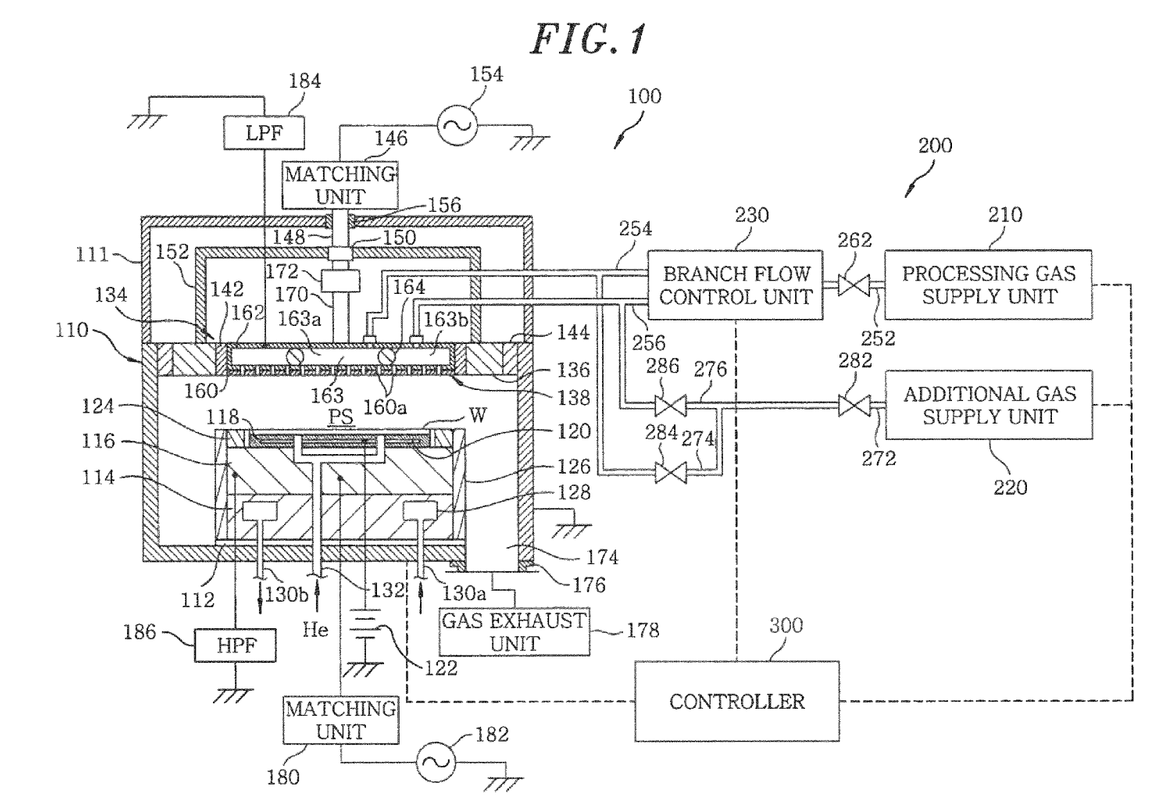
FIG. 1 is a cross sectional view showing a configuration example of a substrate processing apparatus in accordance with an embodiment of the present invention.

First of all, a substrate processing apparatus in accordance with an embodiment of the present invention will be described with reference to FIG. 1. FIG. 1 is a cross sectional view showing a schematic configuration of the substrate processing apparatus in accordance with the embodiment of the present invention. Herein, the substrate processing apparatus is configured as a parallel plate type plasma etching apparatus.

Such a substrate processing apparatus 100 includes a processing chamber 110 formed of a substantially cylindrical processing vessel. The processing vessel is made of aluminum alloy, for example, and is electrically grounded. Further, an inner wall surface of the processing vessel is coated with an alumina film or an yttrium oxide film.

Disposed inside the processing chamber 110 is a susceptor 116 forming a lower electrode serving also as a mounting table for mounting thereon a wafer W as a substrate. To be specific, the susceptor 116 is supported on a cylindrical susceptor support 114 which is provided at a substantially central portion of an inner bottom surface of the processing chamber 110 with an insulating plate 112 disposed therebetween. The susceptor 116 is made of aluminum alloy, for example.

Provided on the susceptor 116 is an electrostatic chuck 118 for supporting the wafer W. The electrostatic chuck 118 has therein an electrode 120 that is electrically connected with a DC power supply 122. Accordingly, the electrostatic chuck 118 can attract and hold thereon the wafer W with the Coulomb force generated by a DC voltage applied from the DC power supply 122 to the electrode 120.

Moreover, a focus ring 124 is provided on top of the substrate 116 to surround the electrostatic chuck 118. Further, a cylindrical inner wall member 126 made of quartz, for example, is attached to outer peripheral surfaces of the susceptor 116 and the susceptor support 114.

A ring-shaped coolant chamber 128 is formed inside the susceptor support 114 to communicate with a chiller unit (not shown), for example, installed outside the processing chamber 110 via lines 130a and 130b. A coolant (liquid coolant or cooling water) is supplied to the coolant chamber 128 to be circulated therein via the lines 130a and 130b, so that a temperature of the wafer W on the susceptor 116 can be controlled.

A gas supply line 132 is provided through a top surface of the electrostatic chuck 118 via the susceptor 116 and the susceptor support 114. Accordingly, a thermally conductive gas (backside gas) such as He gas or the like can be supplied between the wafer W and the electrostatic chuck 118 through the gas supply line 132.

Provided above the susceptor 116 is an upper electrode 134 facing in parallel with the susceptor 116 forming the lower electrode. A plasma generation space PS is formed between the susceptor 116 and the upper electrode 134.

The upper electrode 134 includes a circular plate-shaped inner upper electrode 138 and a ring-shaped outer upper electrode 136 surrounding an outer portion of the inner upper electrode 138. A ring-shaped dielectric material 142 is interposed between the outer upper electrode 136 and the inner upper electrode 138. Airtightly interposed between the outer upper electrode 136 and an inner peripheral wall of the processing chamber 110 is a ring-shaped insulating shielding member 144 made of alumina, for example.

A first high frequency power supply 154 is electrically connected with the outer upper electrode 136 via a power feeder 152, a connector 150, an upper power supply rod 148 and a matching unit 146. The first high frequency power supply 154 can output a high frequency voltage having a frequency of 40 MHz or higher (e.g., 60 MHz).

The power feeder 152 is formed in a substantially cylindrical shape having an open bottom, for example, and has a lower portion connected with the outer upper electrode 136. A lower portion of the upper power supply rod 148 is electrically connected with an upper central portion of the power feeder 152 through the connector 150. An upper portion of the upper power supply rod 148 is connected with an output side of the matching unit 146. The matching unit 146 is connected with the first high frequency power supply 154 and thus can match an internal impedance of the first high frequency power supply 154 to a load impedance.

An exterior of the power feeder 152 is covered with a cylindrical ground conductor 111 having a sidewall of a diameter substantially same as that of the processing chamber 110. A lower portion of the ground conductor 111 is connected with an upper portion of the sidewall of the processing chamber 110. The aforementioned upper power supply rod 148 penetrates through an upper central portion of the ground conductor 111. An insulation member 156 is interposed at a contact portion between the ground conductor 111 and the upper power supply rod 148.

The inner upper electrode 138 forms a shower head for injecting a specific gas on the wafer W mounted on the susceptor 116. Further, the inner upper electrode 138 includes a circular electrode plate 160 having a plurality of gas injection openings 160a and an electrode support 162 for attachably and detachably supporting a top surface of the electrode plate 160. The electrode support 162 is formed in a circular plate shape having a diameter substantially same as that of the electrode plate 160.

The electrode support 162 forms therein a buffer chamber 163 of a circular plate-shaped space. An annular partition wall member 164 provided in the buffer chamber 163 partitions the buffer chamber 163 into an inner and an outer buffer chamber, i.e., a first buffer chamber 163a formed of a circular plate-shaped space and a second buffer chamber 163b formed of a ring-shaped space surrounding the first buffer chamber 163a. The annular partition wall member 164 is formed of an O-ring, for example.

The first and the second buffer chamber 163a and 163b are configured to respectively face a central region (central portion) of the wafer W on the susceptor 116 and a peripheral region (edge portion) thereof surrounding the central region.

The gas injection openings 160a communicate with bottom surfaces of the buffer chambers 163a and 163b, thereby allowing a specific gas to be injected through the first and the second buffer chamber 163a and 163b to the central and the edge portion of the wafer W, respectively. A gas supply system 200 is configured to supply the specific gas to each of the buffer chambers 163a and 163b.

As shown in FIG. 1, a lower power feeder 170 is electrically connected with a top surface of the electrode support 162. The lower power feeder 170 is connected with the upper power supply rod 148 via the connector 150. A variable condenser 172 is provided in the lower power feeder 170. By adjusting an electrostatic capacitance of the variable condenser 172, it is possible to adjust a comparative ratio between an intensity of an electric field formed right under the outer upper electrode 136 and that of an electric field formed right under the inner upper electrode 138, the electric fields being formed by the high frequency voltage applied from the first high frequency power supply 154.

A gas exhaust port 174 is formed at a bottom portion of the processing chamber 110 and connected via a gas exhaust line 176 with a gas exhaust unit 178 having a vacuum pump and the like. By exhausting an inside of the processing chamber 110 with the use of the gas exhaust unit 178, the inside of the processing chamber 110 can be depressurized to a desired vacuum level.

A second high frequency power supply 182 is electrically connected with the susceptor 116 via a matching unit 180. The second high frequency power supply 182 can output a high frequency voltage having a frequency between 2 MHz and 20 MHz, e.g., a frequency of 2 MHz.

A low pass filter 184 is electrically connected with the inner upper electrode 138 of the upper electrode 134. The low pass filter 184 blocks the high frequency power from the first high frequency power supply 154 and passes the high frequency from the second high frequency power supply 182 to the ground. Meanwhile, a high pass filter 186 is electrically connected with the susceptor 116 forming the lower electrode. The high pass filter 186 passes the high frequency power from the first high frequency power supply 154 to the ground.

(Gas Supply System)

Hereinafter, the gas supply system 200 will be described with reference to FIG. 1. Referring to FIG. 1, there is shown an example in which the processing gas is divided into a first processing gas (processing gas for the central portion) to be supplied toward the central portion of the wafer W and a second processing gas (processing gas for the edge portion) to be supplied toward the edge portion of the wafer W. However, there may be provided another example in which the processing gas is divided into more than three types without being limited to the aforementioned two types.

As shown in FIG. 1, the gas supply system 200 includes a processing gas supply unit 210 for supplying processing gas for performing on a wafer a specific process such as a film formation process, an etching process or the like and an additional gas supply unit 220 for supplying specific additional gas.

The processing gas supply unit 210 is connected with a processing gas supply line 252 forming a processing gas feed passage. The processing gas supply line 252 is provided with an opening/closing valve 262 for opening and closing the processing gas supply line 252. Further, the processing gas supply line 252 is branched into a first processing gas branch line 254 forming a first processing gas branch path (hereinafter, referred to as "first branch line 254") and a second processing gas branch line 256 forming a second processing gas branch path (hereinafter, referred to as "second branch line 256").

The first and the second processing gas branch line 254 and 256 are respectively connected with different portions of the upper electrode 134 in the processing chamber 110, e.g., with the first and the second buffer chamber 163a and 163b of the inner upper electrode 138. Further, the first and the second processing gas branch line 254 and 256 may be branched at a position inside or outside a branch flow control unit 230 to be described later.

The gas supply system 200 includes the branch flow control unit (e.g., flow splitter) 230 for controlling respective branch flows of the first and the second processing gas flowing in the first and the second processing gas branch line 254 and 256 based on respective inner pressures of the first and the second branch line 254 and 256.

The additional gas supply unit 220 is connected with an additional gas supply line 272 forming an additional gas feed passage. The additional gas supply line 272 is provided with an opening/closing valve 282 for opening and closing the additional gas supply line 272. The additional gas supply line 272 is branched into a first additional gas branch line 274 forming a first additional gas branch path (hereinafter, referred to as "first branch line 274") and a second additional gas branch line 276 forming a second additional gas branch path (hereinafter, referred to as "second branch line 276").

The first and the second additional gas branch line 274 and 276 are respectively connected with the first and the second processing gas branch line 254 and 256 at positions in a downstream side of the branch flow control unit 230. The first additional gas branch line 274 is provided with an opening/closing valve 284 for opening and closing the first additional gas branch line 274. The second additional gas branch line 276 is provided with an opening/closing valve 286 for opening and closing the second additional gas branch line 276. By controlling the opening/closing valves 284 and 286, the additional gas from the additional gas supply unit 220 can be selectively supplied either to the first branch line 274 or to the second branch line 276. The opening/closing valves 284 and 286 form a flow path switching unit for switching the additional gas branch paths.

The gas supply system 200 distributes the processing gas from the processing gas supply unit 210 into the first and the second processing gas branch line 254 and 256 while controlling branch flows thereof with the use of the branch flow control unit 230. The first processing gas flowing in the first branch line 254 is supplied toward the central portion of the wafer W via the first buffer chamber 163a, whereas the second processing gas flowing in the second branch line 256 is supplied toward the edge portion of the wafer W via the second buffer chamber 163b.

In case the additional gas is supplied to the second processing gas branch line 256, the supply of the additional gas from the additional gas supply unit 220 is initiated by opening the opening/closing valve 286 of the second additional gas branch line 276 while closing the opening/closing valve 284 of the first additional gas branch line 274. Accordingly, the additional gas flows toward the second processing gas branch line 256 via the additional gas supply line 272 and the second additional gas branch line 276 and thus are mixed with the second processing gas. Then, the additional gas is supplied, together with the second processing gas, toward the edge portion of the wafer W via the second buffer chamber 163b.

On the other hand, in case the additional gas is supplied to the first processing gas branch line 254, the supply of the additional gas from the additional gas supply unit 220 is initiated by opening the opening/closing valve 284 of the first additional gas branch line 274 while closing the opening/closing valve 286 of the second additional gas branch line 276. Accordingly, the additional gas flows toward the first processing gas branch line 254 via the additional gas supply line 272 and the first additional gas branch line 274 and thus is mixed with the first processing gas. Then, the additional gas is supplied, together with the first processing gas, toward the central portion of the wafer W via the first buffer chamber 163a. A specific configuration example of the gas supply system 200 will be described later.

The substrate processing apparatus 100 is connected with a controller 300 for controlling each unit thereof. The controller 300 is configured to control the DC power supply 122, the first high frequency power supply 154, the second high frequency power supply 182 and the like in addition to the gas supply system 200 including the processing gas supply unit 210, the additional gas supply unit 220, the branch flow control unit 230 and the like.

(Configuration Example of Controller)

Figure 2:
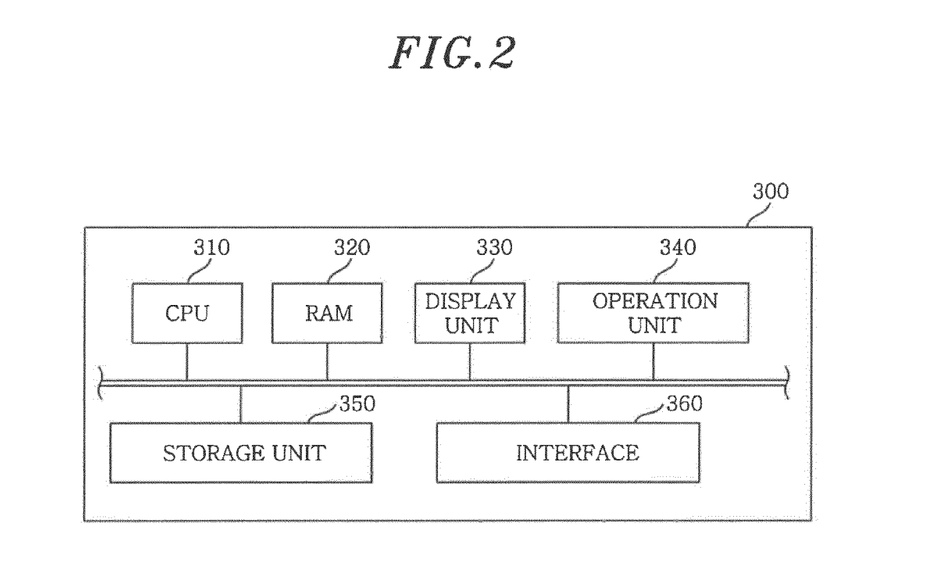
FIG. 2 offers a block diagram illustrating a configuration example of a controller shown in FIG. 1.

Hereinafter, the configuration example of the controller 300 will be described with reference to FIG. 2. FIG. 2 provides a block diagram showing a configuration example of the controller 300. As shown in FIG. 2, the controller 300 includes a CPU (central processing unit) 310 forming a controller main body; a RAM (random access memory) 320 having a memory area used for various data processing performed by the CPU 310; a display unit 330 formed of a liquid crystal display and the like for displaying an operation screen, a selection screen and the like; an operation unit 340 containing a touch panel and the like for allowing an operator to input or edit various data such as process recipes and the like and to output various data such as the process recipes or process logs to a specific storage medium; a storage unit 350; and an interface 360.

The storage unit 350 stores therein, e.g., processing programs for performing various processes of the substrate processing apparatus 100, information (data) required for executing the processing programs and the like. Such a storage unit 350 includes, e.g., a memory, an HDD (hard disk drive) and the like. The CPU 310 reads the program data and the like on demand and executes various processing programs. For example, the CPU 310 controls the gas supply system 200 to perform a gas supply process for supplying a specific gas into the processing chamber 110 before processing the wafer.

The interface 360 is connected with each unit controlled by the CPU 310, such as the branch flow control unit 230, the processing gas supply unit 210, the additional gas supply unit 220 and the like. The interface 360 includes a plurality of I/O ports and the like, for example.

The CPU 310, the RAM 320, the display unit 330, the operation unit 340, the storage unit 350, and the interface 360 are connected with each other by bus lines such as a control bus, a data bus and the like.

(Specific Configuration Example of Gas Supply System)

Figure 3:
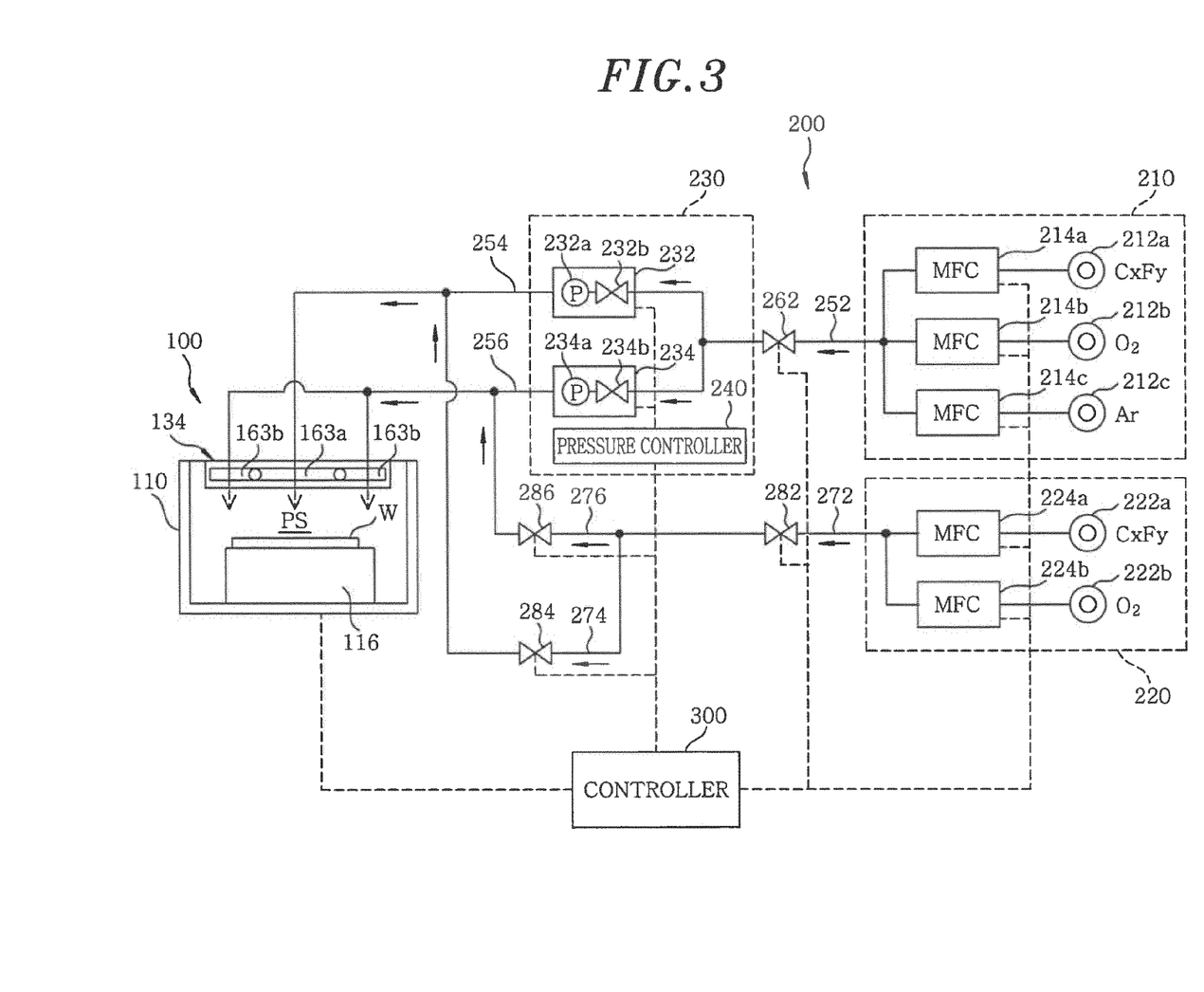
FIG. 3 provides a block diagram describing a configuration example of a gas supply system in accordance with the embodiment of the present invention.

The following is a detailed description on a configuration example of each unit of the gas supply system 200. FIG. 3 is a block diagram illustrating a specific configuration example of the gas supply system 200. As shown in FIG. 3, the processing gas supply unit 210 includes a gas box accommodating therein a plurality of (e.g., three) gas supply sources 212a, 212b and 212c. Lines of the gas supply sources 212a to 212c are connected with the processing gas supply line 252 where gases from the gas supply sources 212a to 212c are joined. Provided on the lines of the gas supply sources 212a to 212c are mass flow controllers 214a to 214c for adjusting respective flow rates of the gases therefrom. The gases from the gas supply sources 212a to 212c of the processing gas supply unit 210 are mixed at a preset flow rate ratio. Next, the mixed gas flows along the processing gas supply line 252 and then is distributed into the first and the second branch line 254 and 256.

As shown in FIG. 3, the gas supply source 212a airtightly seals therein, e.g., a $C_XF_Y$ gas (a fluorocarbon-based fluorine compound such as $CF_4$, $C_4F_6$, $C_4F_8$, $C_5F_8$ or the like) as an etching gas; the gas supply source 212b airtightly seals therein, e.g., an $O_2$ gas as a gas for controlling a deposition of CF-based reaction products; and the gas supply source 212c airtightly seals therein, e.g., an Ar gas as a rare gas serving as a carrier gas. The number of gas supply sources of the processing gas supply unit 210 may be one, two or more than four without being limited to the example shown in FIG. 3.

As exemplarily shown in FIG. 3, the additional gas supply unit 220 includes a gas box accommodating therein a plurality of (e.g., two) gas supply sources 222a and 222b. Lines of the gas supply sources 222a and 222b are connected with the additional gas supply line 272 where gases from the gas supply sources 222a and 222b are joined. Provided on the lines of the gas supply sources 222a and 222b are mass flow controllers 224a and 224b for adjusting respective flow rates of the gases therefrom. One of the gases from the gas supply sources 222a and 222b of the additional gas supply unit 220 is selected or both of them are mixed at a preset flow rate ratio. Next, the selected or the mixed gas flows along the additional gas supply line 272 and then is supplied either to the first processing gas branch line 254 or to the second processing gas branch line 256 at a downstream side of the branch flow control unit 230.

The gas supply source 222a airtightly seals therein a $C_XF_Y$ gas capable of facilitating an etching, for example. The gas supply source 222b airtightly seals therein an $O_2$ gas capable of controlling a deposition of CF-based reaction products, for example. The number of gas supply sources of the additional gas supply unit 220 may be one or more than three without being limited to the example shown in FIG. 3.

The branch flow control unit 230 includes a pressure control unit 232 for controlling an inner pressure of the first processing gas branch line 254 and a pressure control unit 234 for controlling an inner pressure of the second processing gas branch line 256. To be specific, the pressure control unit 232 has a pressure sensor 232a for detecting an inner pressure of the first processing gas branch line 254 and a valve 232b for controlling an open-close degree of the first processing gas branch line 254. The pressure controller 234 has a pressure sensor 234a for detecting an inner pressure of the second processing gas branch line 256 and a valve 234b for controlling an open-close degree of the second processing gas branch line 256.

The pressure control units 232 and 234 are connected with a pressure controller 240 for controlling, in accordance with instructions from the controller 300, open-close degrees of the valves 232b and 234b based on the pressures detected by the pressure sensors 232a and 234a, respectively. The controller 300 controls the branch flow control unit 230 by regulating a pressure ratio, for example. In such a case, the pressure controller 240 controls respective open-close degrees of the valves 232b and 234b to achieve a target flow rate ratio between the first and the second processing gas in accordance with instructions from the controller 300, i.e., a target pressure ratio between the inner pressures of the first and the second processing gas branch line 254 and 256. The pressure controller 240 may be built in the branch flow control unit 230, as a control board, or may be provided separately from the branch flow control unit 230. Further, the pressure controller 240 may be provided inside the controller 300.

In such a substrate processing apparatus 100, before an etching process and the like are performed on the wafer, the gas supply system 200 supplies a specific gas into the processing chamber 110. To be specific, the supply of the processing gas from the processing gas supply unit 210 is initiated and, then, the branch flow control unit 230 is pressure-ratio-controlled. After the pressure ratio between the inner pressures of the first and the second processing gas branch line 254 and 256 is regulated to be kept at the target pressure ratio, the additional gas from the additional gas supply unit 220 is supplied either to the first processing gas branch line 254 or to the second processing gas branch line 256.

However, problems can develop when the additional gas is supplied either to the first processing gas branch line 254 or to the second processing gas branch line 256 while the branch flow control unit 230 being pressure-ratio-controlled. For example, in case the additional gas is supplied to the second processing gas branch line 256, the inner pressure of the second branch line 256 becomes higher than that of the first branch line 254 and, accordingly, the pressure ratio therebetween is changed. In order to regain the target pressure ratio, the branch flow control unit 230 automatically controls to adjust respective open-close degrees of the valves 232b and 234b and, thus, the flow rate of the first processing gas may be increased from the value set before the supply of the additional gas. As a result, the flow rate ratio between the first and the second processing gas is changed by supplying the additional gas.

To that end, the additional gas is supplied after fixing the valves 232b and 234b of the branch flow control unit 230 in a state where the respective inner pressures of the first and the second processing gas branch line 254 and 256 are stable by regulating a pressure ratio therebetween to be kept at a target pressure ratio. In such a case, even if the additional gas is supplied, the valves 232b and 234b are not automatically driven, so that it is possible to prevent the change of the flow rate ratio between the first and the second processing gas.

Since, however, the supply of the additional gas increases the inner pressure of the second processing gas branch line 256, if the valves 232b and 234b of the branch flow control unit 230 are fixed as described above, it makes difficult for the processing gas flow toward the second processing branch line 256 and it rather makes easy for them flow toward the first branch line 254. Consequently, even if the valves 232b and 234b of the branch flow control unit 230 are fixed, the flow rate ratio between the first and the second processing gas is changed by supplying the additional gas.

The same problems can develop when the additional gas is supplied to the first processing gas branch line 254. In other words, since the supply of the additional gas increases the inner pressure of the first processing gas branch line 254, if the valves 232b and 234b of the branch flow control unit 230 are fixed as described above, it is difficult for the processing gas to flow toward the first branch line 254 and easy for them to flow toward the second branch line 256. Thus, the flow rate ratio of the first and the second processing gas is changed by supplying the additional gas.

In order to solve the aforementioned problems, in the gas supply process of the present invention, before the additional gas is supplied, a branch flow control of the branch flow control unit 230 is switched from a pressure ratio control for maintaining at a target pressure ratio inner pressures of the first and the second processing gas branch line 254 and 256 to a fixed pressure control for fixedly maintaining an inner pressure of any one of the first and the second processing gas branch line 254 and 256. Specifically, in case the additional gas is supplied to the first processing gas branch line 254, the supply of the additional gas is initiated after switching the branch flow control mode to a control mode for fixedly maintaining an inner pressure of the second processing branch line 256. Further, in case the additional gas is supplied to the second processing gas branch line 256, the supply of the additional gas is initiated after switching the branch flow control mode to a control mode for fixedly maintaining an inner pressure of the first processing gas branch line 254.

Accordingly, the inner pressure of any one of the branch lines (e.g., the first processing gas branch line 254) is fixedly maintained despite the supply of the additional gas. Therefore, even if the inner pressure of the other branch line (e.g., the second processing gas branch line 256) is changed, the processing gas can flow toward the latter branch line (e.g., the second processing gas branch line 256) without flowing toward the former branch line (e.g., the first processing gas branch line 254). As a result, the flow rate ratio between the first and the second processing gas can be prevented from being changed by supplying the additional gas to any one of the branch lines 254 and 256.

(Specific Example of Gas Supply Process)

Figure 4:
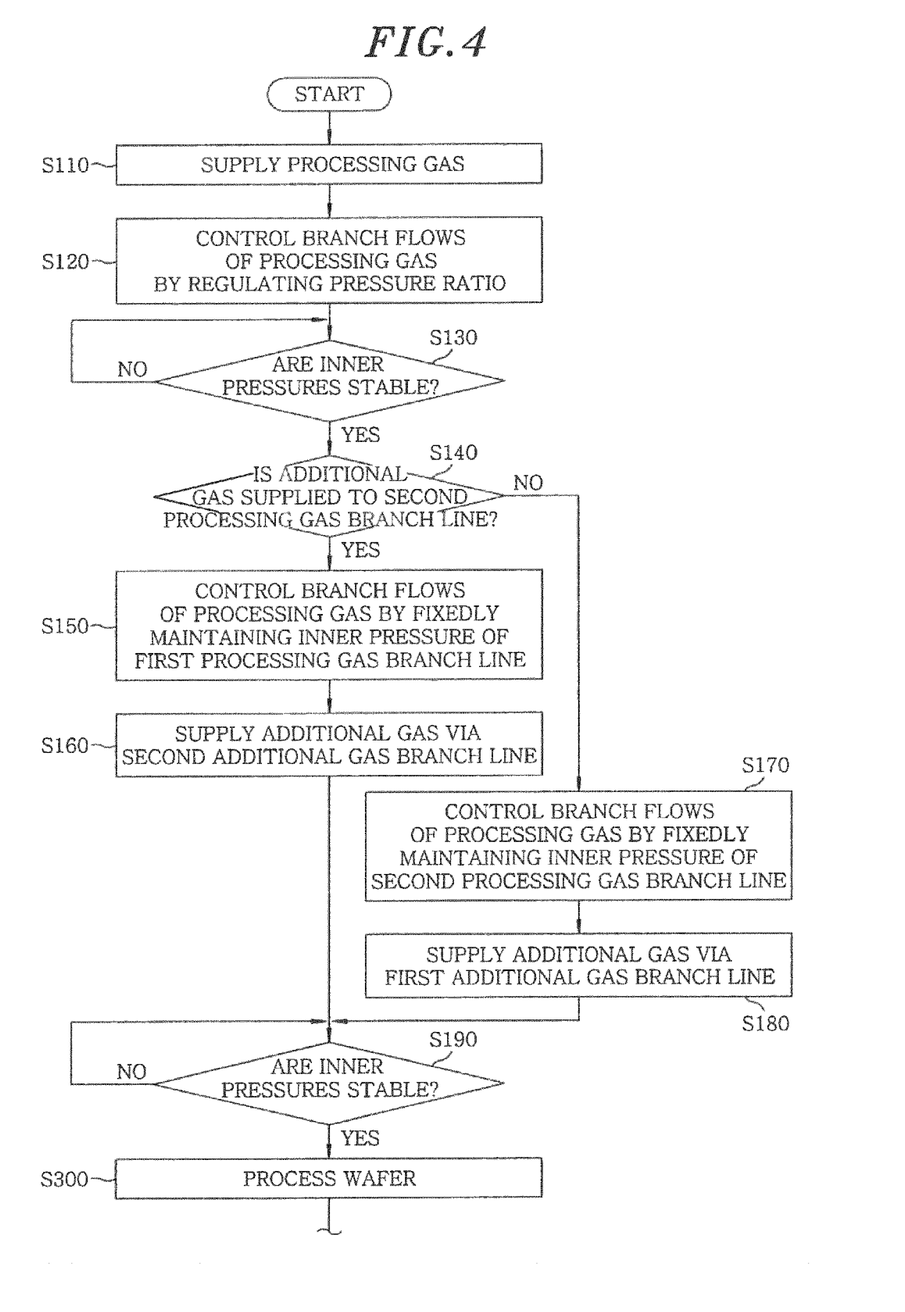
FIG. 4 presents a flowchart of an exemplary processing of the substrate processing apparatus in accordance with the embodiment of the present invention.

The following is a description on a specific example of a gas supply process in accordance with an embodiment of the present invention. FIG. 4 presents a flowchart showing specific exemplary processes of a substrate processing apparatus, including the gas supply process in accordance with this embodiment. First of all, the controller 300 controls, in a step S110, the processing gas supply unit 210 to supply processing gas by opening the opening/closing valve 262. Accordingly, preset gases are supplied from the processing gas supply unit 210 to the processing gas supply line 252 at respective specific flow rates. To be specific, the $C_XF_Y$ gas, the $O_2$ gas and the Ar gas, for example, from the gas supply sources 212a to 212c are supplied at respective specific flow rates and then mixed at a preset mixing ratio. Thus generated gaseous mixture flows as a processing gas along the processing gas supply line 252.

Next, the controller 300 controls, in a step S120, the branch flow control unit 230 to control branch flows of the processing gas by regulating a pressure ratio. To be specific, when the controller 300 issues instructions for a pressure ratio control, the branch flow control unit 230 adjusts, based on the pressures detected by the pressure sensors 232a and 234a, respective open-close degrees of the valves 232b and 234b by controlling the pressure controller 240, thereby regulating to be kept at a target pressure ratio the pressure ratio between the first and the second processing gas branch line 254 and 256. Accordingly, a flow rate ratio between the first and the second processing gas is determined, the first and the second processing gas being supplied to the first and the second chamber 163a and 163b via the first and the second processing gas branch line 254 and 256, respectively.

Thereafter, in a step S130, it is determined whether the respective inner pressures of the first and the second processing gas branch line 254 and 256 are stable or not. If it is determined that the respective inner pressures thereof are stable, it is determined in a step S140 whether the additional gas is supplied to the first processing gas branch line 254 or to the second processing gas branch line 256. To be specific, it is determined whether or not the additional gas is supplied to the second processing gas branch line 256, for example.

If it is determined in the step S140 that the additional gas is supplied to the second processing branch line 256, the controller 300 controls, in a step S150, the branch flow control unit 230 to adjust branch flows of the processing gas by fixedly maintaining an inner pressure of the first processing gas branch line 254.

To be specific, when the controller 300 issues instructions for a fixed pressure control of the inner pressure of the first processing gas branch line 254, the branch flow control unit 230 adjusts, based on the pressures detected by the pressure sensors 232a and 234a, respective open-close degrees of the valves 232b and 234b by controlling the pressure controller 240, thereby fixedly maintaining the inner pressure of the first processing gas branch line 254. At least at this time, the second buffer chamber 163b is supplied with a gaseous mixture having the same gas components as those supplied in the first buffer chamber 163a (the gaseous mixture capable of performing the same etching process).

Next, in a step S160, an additional gas is supplied via the second additional gas branch line 276 by controlling the opening/closing valves 284 and 286. To be specific, the supply of the additional gas from the additional gas supply unit 220 is initiated by opening the opening/closing valve 282 while closing the opening/closing valve 284 of the first additional gas branch line 274 and opening the opening/closing valve 286 of the second additional gas branch line 276. Accordingly, preset additional gas is supplied from the additional gas supply unit 220 to the second processing gas branch line 256 at respective specific flow rates.

At this time, a $C_XF_Y$ gas (e.g., $CF_4$ gas) capable of facilitating the etching is supplied at a specific flow rate from the additional gas supply unit 220a to the second buffer chamber 163b via the second branch line 256. Accordingly, the second buffer chamber 163b is supplied with the processing gas containing a large amount of $CF_4$ gas compared with that contained in processing gas supplied to the first buffer chamber 163a. In this way, the gas components and the flow rate of the processing gas to be supplied to the second buffer chamber 163b are determined.

On the other hand, in case it is determined in the step S140 that the additional gas is supplied to the first processing gas branch line 254, the controller 300 controls, in a step S170, the branch flow control unit 230 to adjust branch flows of the processing gas by fixedly maintaining an inner pressure of the second processing gas branch line 256.

To be specific, when the controller 300 issues instructions for a fixed pressure control of the inner pressure of the second processing gas branch line 256, the branch flow control unit 230 adjusts, based on the pressures detected by the pressure sensors 232a and 234a, respective open-close degrees of the valves 232b and 234b by controlling the pressure controller 240, thereby fixedly maintaining the inner pressure of the second processing gas branch line 256.

Next, in a step S180, an additional gas is supplied via the first additional gas branch line 274 by controlling the opening/closing valves 284 and 286. To be specific, the supply of the additional gas from the additional gas supply unit 220 is initiated by opening the opening/closing valve 282 while closing the opening/closing valve 286 of the second additional gas branch line 276 and opening the opening/closing valve 284 of the first additional gas branch line 274. Accordingly, preset additional gas is supplied from the additional gas supply unit 220 to the first processing gas branch line 254 at respective specific flow rates.

Thereafter, in a step S190, it is determined whether the inner pressures of the first and the second branch line 254 and 256 are stable or not. If it is determined in the step S190 that the respective inner pressures thereof are stable, the wafer is processed in a step S300.

In case the additional gas is supplied to the second processing gas branch line 256 by the aforementioned gas supply process, in the substrate processing apparatus 100, the gaseous mixture of the processing gas is supplied from the first buffer chamber 163a to a vicinity of the central region of the wafer W on the susceptor 116 under the depressurized atmosphere and, also, the gaseous mixture of the processing gas and the additional gas (e.g., the gaseous mixture containing a large amount of $CF_4$ gas) is supplied from the second buffer chamber 163b to the peripheral region (edge portion) of the wafer W. Accordingly, etching characteristics on the peripheral region (edge portion) of the wafer W are controlled to be comparatively adjusted with respect to those on the central region (central portion) of the wafer W, which results in an in-surface uniformity of etching the wafer W.

On the other hand, in case the additional gas is supplied to the first processing gas branch line 254, the gaseous mixture of the processing gas and the additional gas is supplied from the first buffer chamber 163a to a vicinity of the central region of the wafer W on the susceptor 116, whereas the gaseous mixture of the processing gas is supplied from the second buffer chamber 163b to the peripheral region (edge portion) of the wafer W. Accordingly, etching characteristics on the central region (center portion) of the wafer W are controlled to be comparatively adjusted with respect to those on the peripheral region (edge portion) of the wafer W, which results in an in-surface uniformity of etching the wafer W.

Referring to the processes shown in FIG. 4, the processing gas from the processing gas supply unit 210 is distributed into the first and the second branch line 254 and 256. The processing gas distributed into any one of the processing gas branch lines (e.g., the first branch line 254) is supplied to the processing chamber 110 as it is supplied from the processing gas supply unit 210, whereas the processing gas distributed into the other processing gas branch line (e.g., the second branch line 256) is added thereto with the additional gas and then supplied to the processing chamber 110 with adjusted gas components and flow rates. Accordingly, the processing gas having components common to the processing gas branch lines 254 and 256 can be supplied from the processing gas supply unit 210 to each of the processing gas branch lines 254 and 256 and, also, the gas components or the ratio of the flow rates of the processing gas flowing in the latter branch line (e.g., the second branch line 256) can be adjusted by adding thereto the additional gas on demand.

Therefore, when the processing gas distributed into the processing gas branch lines has a large number of common components, the number of lines is reduced compared with a case where each of the gas supply sources has its own branch line. By minimizing the number of lines of the gas supply system 200, the gas supply system 200 can be configured with a simple line configuration. Further, since the branch flows of the processing gas are controlled based on the respective inner pressures of the processing gas branch lines 254 and 256, the gas can be supplied from plural portions in the processing chamber 110 with a simple control operation.

By simply switching, before supplying the additional gas, the branch flow control of the branch flow control unit 230 from the pressure ratio control to the fixed pressure control, even when a pressure ratio between the first and the second processing gas branch line 254 and 256 is changed due to the supply of the additional gas, the branch flow control unit 230 can control the valves 232b and 234b to fixedly maintain an inner pressure of one of the processing gas branch lines (e.g., the first branch line 254).

Therefore, a part of the processing gas required to flow toward the latter branch line (e.g., the second processing gas branch line 256) can be prevented from flowing toward the former branch line (e.g., the first processing gas branch line 254). Accordingly, it is possible to prevent the ratio of the flow rates of the processing gas supplied from the branch flow control unit 230 to the processing gas branch lines from being changed due to supplying the additional gas, which results in realizing the desired in-surface uniformity.

Although FIG. 4 shows a case where the wafer is processed while holding the branch flow control unit 230 fixed-pressure-controlled as switched in the step S150 or S170, the branch flow control of the branch flow control unit 230 may be switched back to the pressure ratio control before processing the wafer.

For example, while a single wafer is processed or a number of wafers are consecutively processed, a temperature of the upper electrode 134 can gradually rise to thereby increase a conductance of the gas injection openings 160a, which hinders a gas flow.

In such a case, since inner pressures of the first and the second processing gas branch line 254 and 256 are to be increased, if the branch flow control mode of the branch flow control unit 230 remains to be at the fixed pressure control, the valves 232b and 234b are adjusted to fixedly maintain an inner pressure of only one of the processing gas branch lines (e.g., the first branch line 254). Hence, the amount of the processing gas flowing toward the other processing gas branch line (e.g., the second branch line 256) will be gradually increased relative to that of the processing gas flowing toward the former processing gas branch line (e.g., the first branch line 254), which leads to a change of the ratio of the flow rates of the processing gas flowing toward the processing gas branch lines.

To this end, the branch flow control can be switched back to the pressure ratio control before processing the wafer. By switching the branch flow control of the branch flow control unit 230 from the fixed pressure control to the pressure ratio control, the pressure ratio between the first and the second processing gas branch line 254 and 256 can be prevented from being changed. This is because if the conductance of the gas injection openings 160a is changed, the respective inner pressures of the first and the second processing gas branch line 254 and 256 are also changed. Accordingly, even when the conductance of the gas injection openings 160a is temporally changed, the ratio of the flow rates of the processing gas flowing toward the first and the second processing gas branch line 254 and 256 can be prevented from being changed.

Figure 5A:
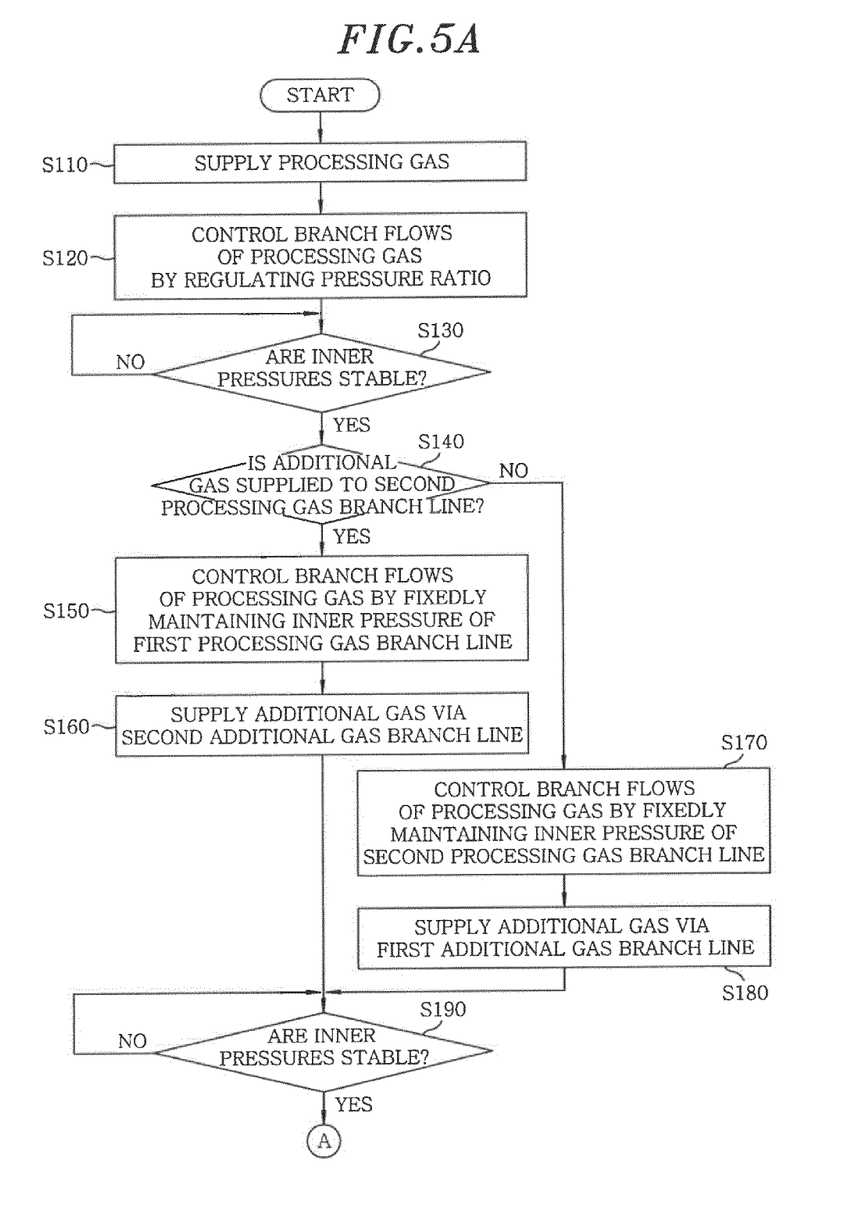
FIGS. 5A and 5B represent a flowchart of another exemplary processing of the substrate processing apparatus in accordance with the embodiment of the present invention.
Figure 5B:
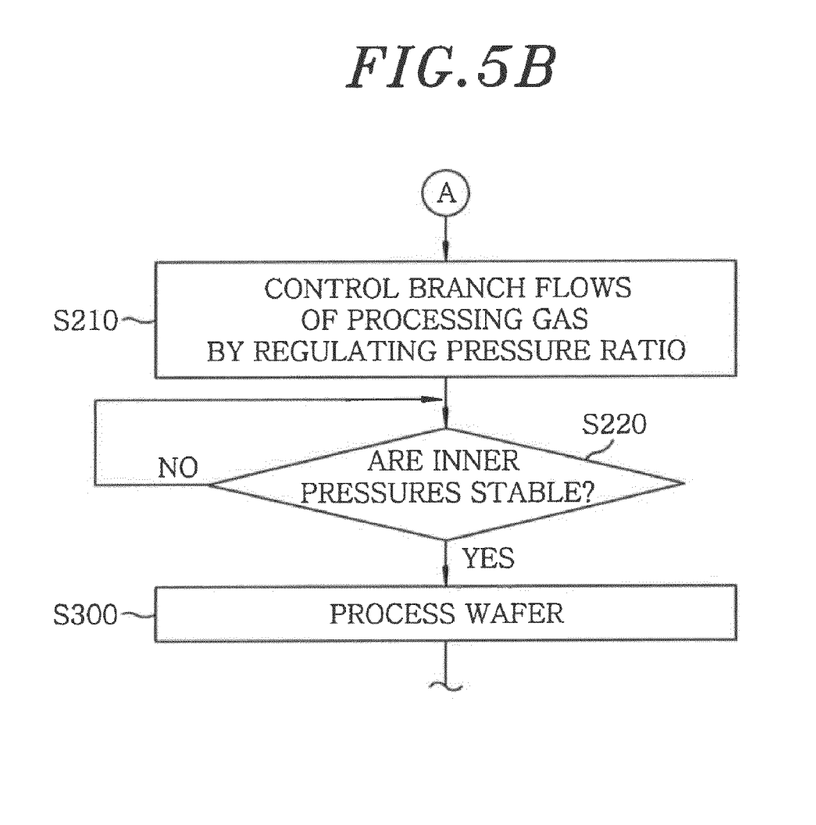

To be specific, processes of steps S210 and S220 are added to be performed before the process of the step S300 as shown in FIGS. 5A and 5B. Referring to the processes shown in FIGS. 5A and 5B, if it is determined in the step S190 that the respective inner pressures of the first and the second processing gas branch line 254 and 256 are stable, the controller 300 switches, in the step S210, the branch flow control of the branch flow control unit 230 to the pressure ratio control. Specifically, a pressure ratio obtained when the respective inner pressures of the first and the second processing gas branch line 254 and 256 are stable is set to be as a new target pressure ratio. Then, the branch flow control of the branch flow control unit 230 is switched to the pressure ratio control in which respective branch flows are controlled to regulate the pressure ratio between the inner pressures of the first and the second processing gas branch line 254 and 256 to be kept at the new target pressure ratio. If additional gas is supplied to any one of the processing gas branch lines, an inner pressure of the corresponding processing gas branch line is changed. Therefore, the pressure ratio needs to be controlled by taking such a pressure change into consideration. Accordingly, the branch flow control unit 230 can adjust the respective branch flows of the first and the second processing gas without changing a flow rate ratio therebetween. For such reasons, the pressure ratio obtained when the respective inner pressures of the first and the second processing gas branch line 254 and 256 are stable is set to be as a new target pressure ratio.

Next, it is checked in the step S220 whether or not the respective inner pressures of the first and the second processing gas branch line 254 and 256 are stable. If it is determined in the step S220 that the inner pressures thereof are stable, the wafer is processed in the step S300.

Referring to the processes shown in FIGS. 5A and 5B, even when the conductance of the gas injection openings 160a of the upper electrode 134 is changed during the processing of the wafer, the processing of the wafer can be performed while preventing a variation of the flow rate ratio between the first and the second processing gas.

The second processing gas branch line 256 of the aforementioned embodiment may be configured as a plurality of branch lines branched from the processing gas supply line 252 so that the additional gas from the additional gas supply unit 220 can be respectively supplied to the second branch lines. In such a case, the processing gas can be supplied separately to plural portions of the peripheral region of the wafer, so that it is possible to more precisely control the uniformity of processing the peripheral region of the wafer.

Although the aforementioned embodiment describes a case where the processing gas supplied from the gas supply system 200 is injected from an upper portion of the processing chamber 110 toward the wafer W, there may be provided, without being limited thereto, another case where the processing gas is injected from, e.g., a side surface of a plasma generation space PS in the processing chamber 110, other portions of the processing chamber 110. In such a case, since specific processing gas can be supplied from an upper portion and a side portion of the plasma generation space PS, it is possible to control a gas concentration in the plasma generation space PS, which leads to an improved in-surface uniformity in processing the wafer.

Further, the aforementioned embodiment describes a case where a flow path for allowing the additional gas from the additional gas supply line 272 to flow is switched by opening and closing the opening/closing valves 284 and 286 respectively provided on the first and the second additional gas branch line 274 and 276. However, there may be provided, without being limited thereto, another case where a flow path for allowing the additional gas from the additional gas supply line 272 to flow is switched by opening and closing another opening/closing valve provided as an example of a flow path switching unit on any one of the first and the second additional gas branch line 274 and 276.

In the aforementioned embodiment, the opening/closing valves 284 and 286 are respectively provided on the first and the second additional gas branch line 274 and 276, so that the additional gas can be supplied from the first and the second additional gas branch line 274 and 276 to the first and the second processing gas branch line 254 and 256, respectively. In such a case, each of the first and the second additional gas branch line 274 and 276 may be provided with a flow rate control unit such as a mass flow controller or the like. Accordingly, it is possible to precisely control respective flow rates of the additional gas flowing toward the first and the second additional gas branch line 274 and 276.

The aforementioned embodiment describes a case in which pressure control units control branch flows of the processing gas flowing toward the processing gas branch lines. However, there may be provided, without being limited thereto, another case in which mass flow controllers control the branch flows of the processing gas flowing toward the processing gas branch lines. Further, although the present invention is applied to a plasma etching apparatus as a substrate processing apparatus in the aforementioned embodiment, the present invention may be applied to another substrate processing apparatus where a processing gas is supplied, e.g., a film forming apparatus such as a plasma CVD apparatus, a sputtering apparatus, a thermal oxidation apparatus or the like. Moreover, the present invention may be applied to a MEMS (micro electro mechanical system) manufacturing apparatus or another substrate processing apparatus for processing as a target substrate an FPD (flat-panel display), a photomask reticle or the like, other than a wafer.

The present invention may be applied to a gas supply system for supplying processing gas to a processing chamber, a substrate processing apparatus and a gas supply method.

As described above, the present invention can provide the gas supply system and the like, capable of achieving desired in-surface uniformity by supplying gas from plural portions in the processing chamber with a simple line configuration and a simple control operation.

While the invention has been shown and described with respect to the embodiments, it will be understood by those skilled in the art that various changes and modification may be made without departing from the scope of the invention as defined in the following claims.

What is claimed is:

1. A gas supply method for use with a gas supply system for supplying a gas into a processing chamber for processing a substrate to be processed, wherein the gas supply system includes a processing gas supply unit for supplying processing gas for processing the substrate to be processed; a processing gas supply line for allowing the processing gas from the processing gas supply unit to flow therein; a first and a second processing gas branch line branched from the processing gas supply line to be connected with different portions of the processing chamber; a branch flow control unit for controlling branch flows of the processing gas distributed from the processing gas supply line to the first and the second processing gas branch line based on inner pressures of the first and the second processing gas branch line, respectively; an additional gas supply unit for supplying additional gas; an additional gas supply line for allowing the additional gas from the additional gas supply unit to flow therein; a first additional gas branch line branched from the additional gas supply line to be connected with the first processing gas branch line at a downstream side of the branch flow control unit; a second additional gas branch line branched from the additional gas supply line to be connected with the second processing gas branch line at a downstream side of the branch flow control unit; and a flow path switching unit for switching a flow path of the additional gas from the additional gas supply line between the first and the second additional gas branch line, the method comprising the steps of:

supplying, before processing the substrate to be processed, the processing gas from the processing gas supply unit while performing a pressure ratio control on the branch flow control unit such that a pressure ratio between the inner pressures of the first and the second processing gas branch line is kept at a target pressure ratio; and supplying the additional gas from the additional gas supply unit after the inner pressures of the first and the second processing gas branch line become stable to be at a first and a second stable inner pressure, wherein in case of supplying the additional gas to the second processing gas branch line via the second additional gas branch line, the additional gas is supplied from the additional gas supply unit after the control unit switches the pressure ratio control on the branch flow control unit to a first fixed pressure control that controls the branch flows such that the first stable inner pressure is maintained in the first processing gas branch line, whereas in case of supplying the additional gas to the first processing gas branch line via the first additional gas branch line, the additional gas is supplied from the additional gas supply unit after the control unit switches the pressure ratio control on the branch flow control unit to a second fixed pressure control that controls the branch flows such that the second stable inner pressure is maintained in the second processing gas branch line.

2. The gas supply method of claim 1, further comprising the steps of:

setting, when the inner pressures of the first and the second processing gas branch line become stable to be at a third and a fourth stable inner pressure after supplying the additional gas, a pressure ratio between the third and the fourth stable inner pressure as a new target pressure ratio; and switching the fixed pressure control on the branch flow control unit to another pressure ratio control that controls the branch flows such that a pressure ratio between the inner pressures of the first and the second processing gas branch line is kept at the new target pressure ratio.

3. The gas supply method of claim 1, wherein the branch flow control unit has valves for controlling flow rates of the processing gas flowing through the first and the second processing gas branch line, and pressure sensors that detect the inner pressures of the first and the second processing gas branch line, respectively, and wherein a ratio of the flow rates of the processing gas flowing through the first and the second processing gas branch line is controlled by controlling the valves based on the inner pressures detected by the pressure sensors.

4. The gas supply method of claim 1, wherein the processing gas supply unit has a plurality of gas supply sources to supply to the processing gas supply line the processing gas obtained by mixing gases from the gas supply sources at a specific flow rate ratio.

5. The gas supply method of claim 1, wherein the additional gas supply unit has a number of gas supply sources to supply to the additional gas supply line, the additional gas obtained by selecting a gas from the gas supply sources or by mixing gases therefrom at a specific gas flow rate ratio.

6. The gas supply method of claim 1, wherein the first processing gas branch line is arranged to supply the processing gas flowing therein toward a central region on a surface of the substrate disposed in the processing chamber; and the second processing gas branch line is arranged to supply the processing gas flowing therein toward a peripheral region on the surface of the substrate.

7. The gas supply method of claim 1, wherein the second processing gas branch line is configured as plural branch lines branched from the processing gas supply line, and the additional gas from the additional gas supply unit is supplied to each of the plural branch lines.

8. The gas supply method of claim 1, wherein the pressure sensors detect the inner pressures of the first and the second processing gas branch line, respectively, at the downstream side of the branch flow control unit.

* * * * *